United States Patent
Yu et al.

(10) Patent No.: US 9,887,132 B2
(45) Date of Patent: Feb. 6, 2018

(54) METHOD FOR FORMING SEMICONDUCTOR STRUCTURE

(71) Applicant: TAIWAN SEMICONDUCTOR MANUFACTURING CO., LTD., Hsinchu (TW)

(72) Inventors: Hung-Chih Yu, Hsinchu (TW); Chien-Mao Chen, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/616,836

(22) Filed: Jun. 7, 2017

(65) Prior Publication Data

US 2017/0271206 A1    Sep. 21, 2017

Related U.S. Application Data

(62) Division of application No. 14/857,383, filed on Sep. 17, 2015, now Pat. No. 9,704,803.

(51) Int. Cl.

| H01L 23/482 | (2006.01) |
| H01L 23/532 | (2006.01) |
| H01L 23/538 | (2006.01) |
| H01L 23/528 | (2006.01) |
| H01L 21/768 | (2006.01) |
| H01L 21/764 | (2006.01) |
| H01L 23/522 | (2006.01) |
| H01L 23/00 | (2006.01) |
| H01L 21/48 | (2006.01) |

(52) U.S. Cl.
CPC ...... *H01L 21/76888* (2013.01); *H01L 21/485* (2013.01); *H01L 21/764* (2013.01); *H01L 21/7682* (2013.01); *H01L 23/4821* (2013.01); *H01L 23/528* (2013.01); *H01L 23/5222* (2013.01); *H01L 23/5329* (2013.01); *H01L 23/5381* (2013.01); *H01L 23/53223* (2013.01); *H01L 23/53238* (2013.01); *H01L 23/564* (2013.01)

(58) Field of Classification Search
CPC .......... H01L 21/76886; H01L 21/7682; H01L 21/764; H01L 23/4821; H01L 23/528; H01L 23/5329; H01L 23/5381; H01L 23/5222

See application file for complete search history.

(56) References Cited

U.S. PATENT DOCUMENTS

| 5,407,860 A * | 4/1995 | Stoltz | H01L 21/7682 257/E21.576 |
| 5,599,745 A * | 2/1997 | Reinberg | H01L 21/7682 257/E21.581 |

(Continued)

*Primary Examiner* — David Zarneke
(74) *Attorney, Agent, or Firm* — Maschoff Brennan (57) ABSTRACT

A semiconductor structure and a method for forming the semiconductor structure are provided. In various embodiments, the method for forming a semiconductor structure includes following steps. A structure on a semiconductor substrate is received, which the structure includes at least two conductive lines and a shorting bridge, and the conductive lines electrically connected to each other through the shorting bridge. The shorting bridge is insulated to make the conductive lines electrically isolated to each other.

20 Claims, 9 Drawing Sheets

(56) References Cited

U.S. PATENT DOCUMENTS

| | | | | |
|---|---|---|---|---|
| 5,641,712 | A | * | 6/1997 | Grivna ................ H01L 21/7682 204/192.37 |
| 5,677,241 | A | * | 10/1997 | Manning ........... H01L 21/31051 257/E21.243 |
| 6,083,821 | A | * | 7/2000 | Reinberg ............ H01L 21/7682 257/522 |
| 6,083,823 | A | | 7/2000 | Dave et al. |
| 8,816,472 | B2 | * | 8/2014 | Isobayashi .............. H01L 23/48 257/522 |
| 8,822,303 | B2 | * | 9/2014 | Chen ................... H01L 21/7682 257/E21.573 |
| 9,159,606 | B1 | * | 10/2015 | Purayath ............ H01L 21/7682 |
| 9,171,781 | B2 | * | 10/2015 | Lee ..................... H01L 23/5222 |
| 9,418,913 | B2 | | 8/2016 | Shim et al. |
| 2002/0017726 | A1 | | 2/2002 | Dave et al. |
| 2010/0018956 | A1 | | 1/2010 | Watts et al. |
| 2013/0154114 | A1 | | 6/2013 | Wang et al. |
| 2015/0115469 | A1 | | 4/2015 | Lee et al. |
| 2015/0206887 | A1 | | 7/2015 | Kuo et al. |
| 2016/0305892 | A1 | | 10/2016 | Tsuchiya |

\* cited by examiner

Fig. 5B

METHOD FOR FORMING SEMICONDUCTOR STRUCTURE

CROSS-REFERENCE TO RELATED APPLICATION

This application is a Divisional Application of the U.S. patent application Ser. No. 14/857,383, filed Sep. 17, 2015, the full disclosures of which are incorporated herein by reference.

BACKGROUND

The semiconductor industry has experienced exponential growth, and has progressed in pursuit of higher device density and performance, and lower costs. Technological advances in integrated circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

In the general manufacturing scheme of an IC, there are two major parts, the front end of line (FEOL) processing and the back end of line (BEOL) processing. In general, The BEOL contains passive, linear devices made from metals and insulators, such as signal and power wires, transmission lines, metal resistors, metal-insulator-metal (MIM) capacitors, inductors, fuses, etc., and the BEOL may include the devices being wired together with a patterned multilevel metallization process.

However, such scaling down has also increased the complexity of processing and manufacturing ICs. As higher device density and the scaling down, short circuits may frequently occur during the BEOL processing in ICs, resulting in the decrease of yield.

Accordingly, with the high demands on scaling down of the ICs, the method for forming such semiconductor structure has to be continuously improved so as to obtain a more satisfactory semiconductor structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As aforementioned, the back-end-of-line (BEOL) may include the devices being wired together with a patterned multilevel conducting process. After the patterned multilevel conducting process, the patterned conductive layers are formed in a level-by-level scheme and on a semiconductor substrate which is formed in the front end of line (FEOL) processing. Each of the patterned conductive layers has a plurality of conductive lines and vias. Since scaling down the dimension of the semiconductor structure, the density of the conductive lines of each patterned conductive layer may increase so as to enhance the probability of short circuits, resulting in the decrease of yield. It becomes more challenging for forming a semiconductor structure with scaled down dimensions. Therefore, the method for forming a semiconductor structure with scaled down dimensions and without short circuits occurring is continually required to be improved.

In order to solve the above-mentioned problems, the present disclosure provides a semiconductor structure and a method for forming the same. The method includes an insulating process that is beneficial for conductive lines electrically isolated to each other. Therefore, the insulating process may improve the short circuit issue of the conductive lines.

Figure 1A:
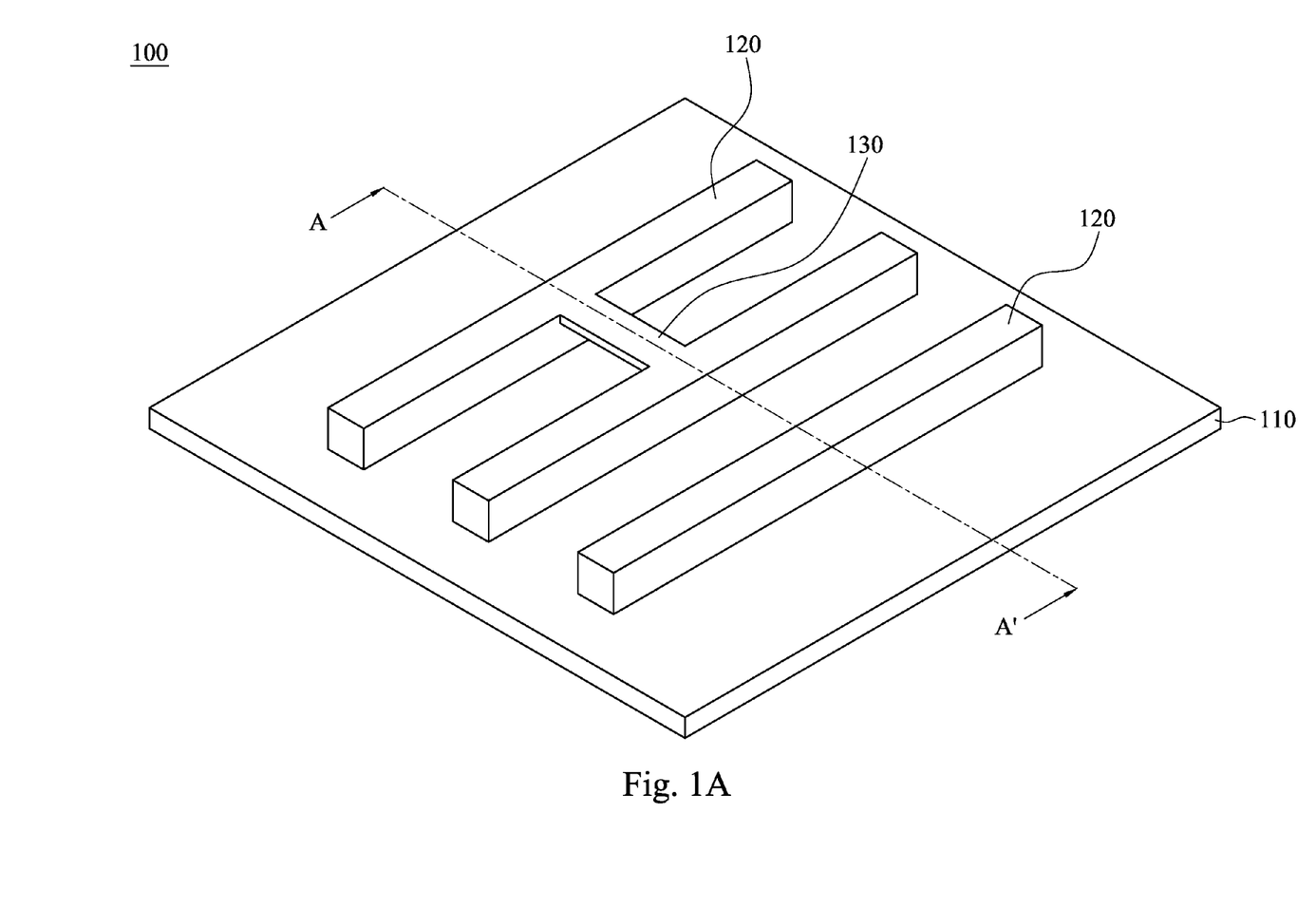
FIG. 1A is a three dimensional view of a semiconductor structure in accordance with some embodiments.

FIG. 1A is a three dimensional view of a semiconductor structure 100 in accordance with some embodiments. One should note that some of the structures have been omitted for the purpose of simplicity and clarity. FIG. 1A illustrates a plurality of conductive lines 120, for example three conductive lines 120, which are disposed on a semiconductor substrate 110. The two conductive lines 120 on the right which are not connected is an ideal state, but the short circuits often occur through a shorting bridge 130 formed during the BEOL processing, and the shorting bridge 130 electrically connects the two conductive lines 120 on the left shown in FIG. 1A. A connection between the conductive lines 120, which causes short circuits, is a defect in the semiconductor structure 100, and occurs because of many reasons. For instance, performing chemical mechanical polishing (CMP) to the conductive lines 120 may bring some conductive materials from the conductive lines 120 to a space between the two conductive lines 120 so as to form a shorting bridge 130 electrically connected the two conductive lines 120. The conductive lines 120 are produced by patterning a metal layer, so it may be metal lines, conductive patterns or metal patterns. In addition, a wider metal critical dimension (CD) or/and a weakness point due to metal/via layout dependence is/are easy to form a shorting connection between two metal lines, and it will be discussed in greater detail in FIGS. 4A-4B.

In some embodiments, the semiconductor substrate 110 is formed during the front end of line (FEOL) processing. In general, the semiconductor substrate contains active and nonlinear devices requiring a semiconductor, such as transistors, diodes, varactors, photodetectors, photo-emitters, polysilicon resistors, MOS (metal-oxide-silicon or metal-oxide-semiconductor) capacitors, waveguides, waveguide modulators, etc. The FEOL processing may include a transistor and other active or nonlinear devices being formed on a semiconductor wafer surface, for example a silicon (Si) wafer.

According to some embodiments, the conductive lines 120 shown in FIG. 1A belong to a layer of the patterned conductive layers which are formed during the BEOL processing. In an embodiment, the conductive lines 120 are made of cooper (Cu), aluminum (Al) or other suitable materials. The formation of the conductive lines 120 includes deposition and patterning. At first, a conductive layer (not shown), for example, a metal layer, is deposited on the semiconductor substrate 110 by chemical vapor deposition (CVD), physical vapor deposition (PVD), plating, atomic layer deposition (ALD) or other suitable techniques. Thereafter, the conductive layer is patterned using a photolithography process to form a patterned photoresist layer (not shown) and an etching process to etch the conductive layer within the openings of the patterned photoresist layer. In another embodiment, the patterned mask layer includes a patterned photoresist layer formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper methods such as maskless photolithography, electron-beam writing, ion-beam writing, and molecular imprint. In yet another embodiment, the etching process is applied to the conductive layer through the openings of the patterned photoresist layer. The etching process may include dry etching, wet etching or a combination thereof to selectively remove undesired portions of the conductive layer so as to form the conductive lines 120 shown in FIG. 1A.

Figure 1B:
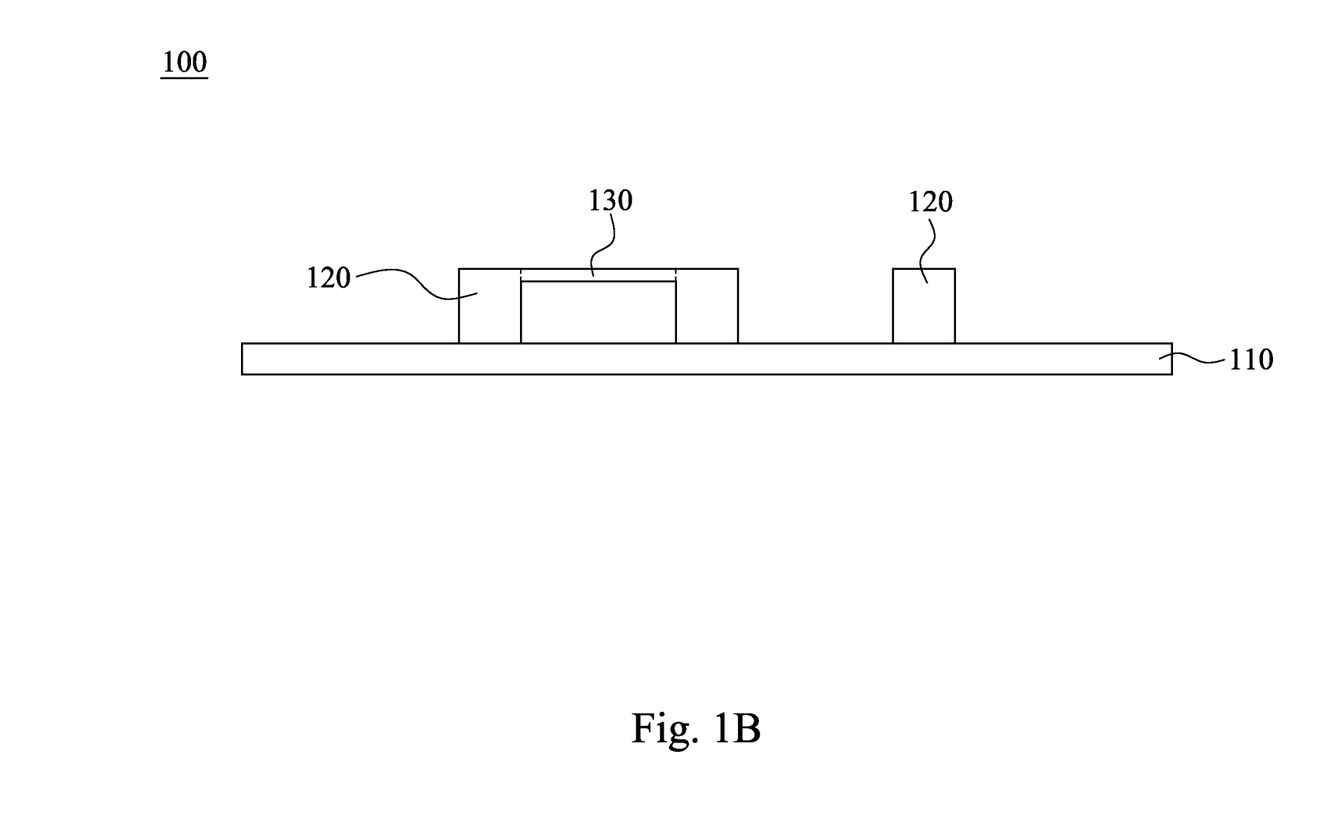
FIG. 1B is a cross-sectional view along the line A-A' in FIG. 1A according to some embodiments.

FIG. 1B is a cross-sectional view along the line A-A' in FIG. 1A according to some embodiments of the present disclosure. FIG. 1B illustrates the cross-sectional view of the semiconductor structure 100 shown in FIG. 1A. As shown in FIG. 1B, the conductive lines 120 have a cross section including a rectangle. The semiconductor structure 100 includes a semiconductor substrate 110, a plurality of conductive lines 120 which are disposed on the semiconductor substrate 110, and at least one shorting bridge 130 which is sandwiched between and in contact with the conductive lines 120. It is noted that the shorting bridge 130 is formed between the two conductive lines 120 on the left shown in FIG. 1B. The shorting bridge 130 may be formed at various horizontal positions between the two conductive lines 120. For instance, the shorting bridge 130 may be formed between the top surfaces of the conductive lines 120, and has the same horizontal plane with the top surfaces of the conductive lines 120, as shown in FIG. 1B. Besides, the number of the shorting bridge 130 may be more than one, and the materials of the shorting bridge 130 and the conductive lines 120 are the same which include cooper (Cu), aluminum (Al) or other suitable materials. The shorting bridge 130 may be formed by extending the conductive materials from the top surface of one conductive line 120 to another during the BEOL processing, resulting in short circuits.

Figure 2A:
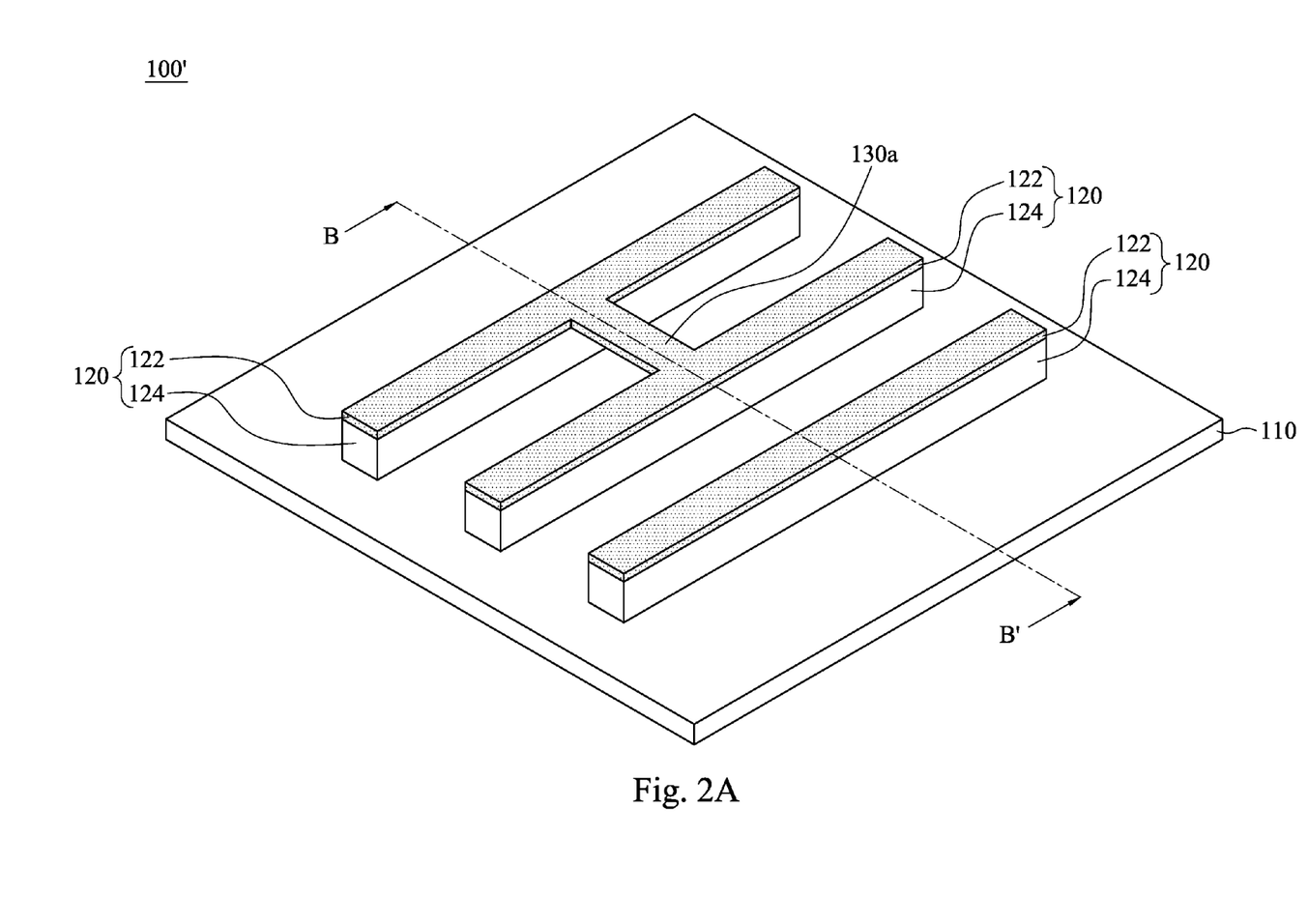
FIG. 2A is a three dimensional view of a semiconductor structure in accordance with some embodiments.

FIG. 2A is a three dimensional view of a semiconductor structure 100' in accordance with some embodiments. In order to solve the short circuit issue as described above, the present disclosure provides a method, which may insulate the shorting bridge 130 (shown in FIG. 1A-1B) so as to make the conductive lines 120 electrically isolated to each other. The method includes providing a patterned mask (not shown) to cover the conductive lines 120 and expose the shorting bridge 130 (shown in FIG. 1A-1B), and then, insulating the shorting bridge 130 to form an insulated shorting bridge 130a. The insulation process of the shorting bridge 130 may include, but not limit to, oxidizing or nitriding the shorting bridge 130. For instance, the shorting bridge 130 may be oxidized by applying $O_2$ plasma to the shorting bridge 130. The $O_2$ plasma with $Ar^+$ or $N^+$ gas may bombard the shorting bridge 130 so as to form an oxidized shorting bridge.

In some embodiments, non-conductive surfaces 122 of the conductive lines 120 may also be formed while insulating the shorting bridge 130 (shown in FIGS. 1A-1B), so that each of the conductive lines 120 has a non-conductive surface 122 and a remaining conductive portion 124 shown in FIG. 2A. FIG. 2A illustrates a semiconductor structure 100' formed after insulating the shorting bridge 130 (shown in FIGS. 1A-1B) and forming non-conductive surfaces 122 of the conductive lines 120 of the semiconductor structure 100 in FIG. 1A. Forming non-conductive surfaces 122 of the conductive lines 120 may include, but not limit to, oxidizing or nitriding top surfaces of the conductive lines 120. In greater detail, the top surfaces of the conductive lines 120 may be oxidized by applying $O_2$ plasma to the top surfaces of the conductive lines 120. The $O_2$ plasma with $Ar^+$ or $N^+$ gas may bombard the top surfaces of the conductive lines 120 so as to form the non-conductive surfaces 122 of the conductive lines 120. According to some embodiments, the shorting bridge 130 and the top surfaces of the conductive lines 120 in FIGS. 1A-1B may be oxidized in a step at the same time.

Figure 2B:
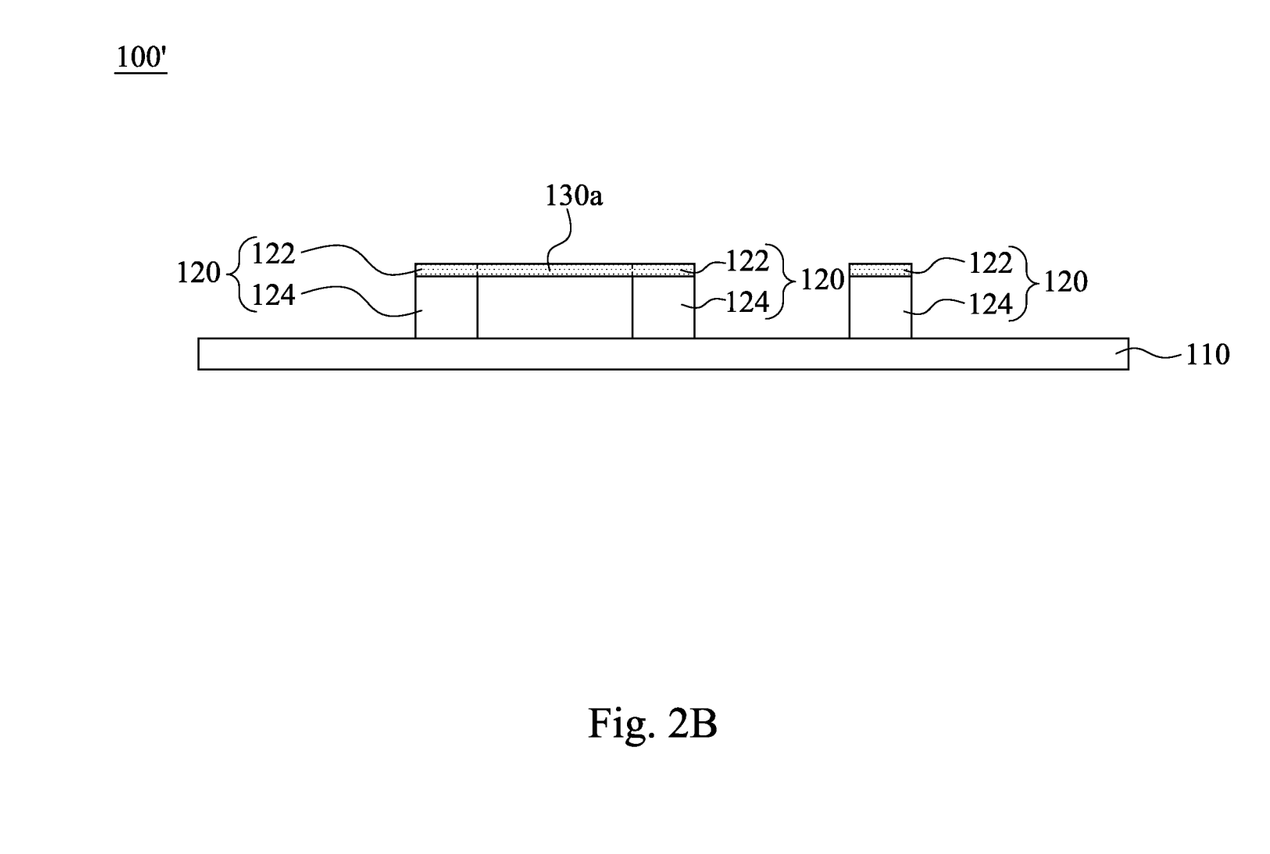
FIG. 2B is a cross-sectional view along the line B-B' in FIG. 2A according to some embodiments.

FIG. 2B is a cross-sectional view along the line B-B' in FIG. 2A according to some embodiments of the present disclosure. FIG. 2B illustrates the cross-sectional view of the semiconductor structure 100' shown in FIG. 2A. According to some embodiments, the semiconductor structure 100' includes a semiconductor substrate 110, a plurality of conductive lines 120 which are disposed on the semiconductor substrate 110, and at least one insulated shorting bridge 130a which is sandwiched between and in contact with the conductive lines 120.

In some embodiments, a thickness of the insulated shorting bridge 130a is less than or equal to a thickness of the non-conductive surfaces 122 of the conductive lines 120. As shown in FIG. 2B, the thickness of the insulated shorting bridge 130a is equal to the thickness of the non-conductive surfaces 122 of the conductive lines 120. Furthermore, the thickness of the non-conductive surfaces 122 of the conductive lines 120 is about 30 Å to about 150 Å according to some embodiment. Particularly, the thickness of the non-conductive surfaces 122 of the conductive lines 120 may be about 30 Å to about 100 Å. In addition, the insulated shorting bridge 130a and the non-conductive surfaces 122 of the conductive lines 120 are co-planar and have the same horizontal plane shown in FIG. 2B.

According to some embodiments, a material of the insulated shorting bridge 130a and the non-conductive surfaces 122 of the conductive lines 120 are the same, and the same material may be a high resistance material. In an embodiment, the resistance value of the high resistance material is about $1.6*10^{-6}$ Ω-cm to about $1.6*10^{4}$ Ω-cm. The high resistance material may include, but not limit to, copper oxide, copper nitride, aluminum oxide, aluminum nitride or other suitable materials. Particularly, the copper oxide may include $Cu_xO_y$, x is 1 or 2, and y is 1 or 2.

The thickness of the conductive lines 120 is greater than the thickness of the shorting bridge 130 (shown in FIG. 1A-1B), so that each of the conductive lines 120 has a remaining conductive portion 124 after oxidizing. For instance, the thickness of the conductive lines 120 is about 800 Å to 1000 Å, and the thickness of the shorting bridge 130 (shown in FIG. 1A-1B) is about 30 Å to about 150 Å, particularly about 30 Å to about 100 Å. Therefore, only the top surfaces of the conductive lines 120 and the entire shorting bridge 130 (shown in FIG. 1A-1B) are transformed to non-conductive after the oxide treatment process. After the oxide treatment process, the shorting bridge 130 (shown in FIG. 1A-1B) is totally converted into the insulated shorting bridge 130a, but the conductive lines 120 are merely oxidized the top surfaces and still have the remaining conductive portions 124 which can transmit electrical current. Accordingly, it can solve the short circuit issue during the BEOL processing.

Figure 3:
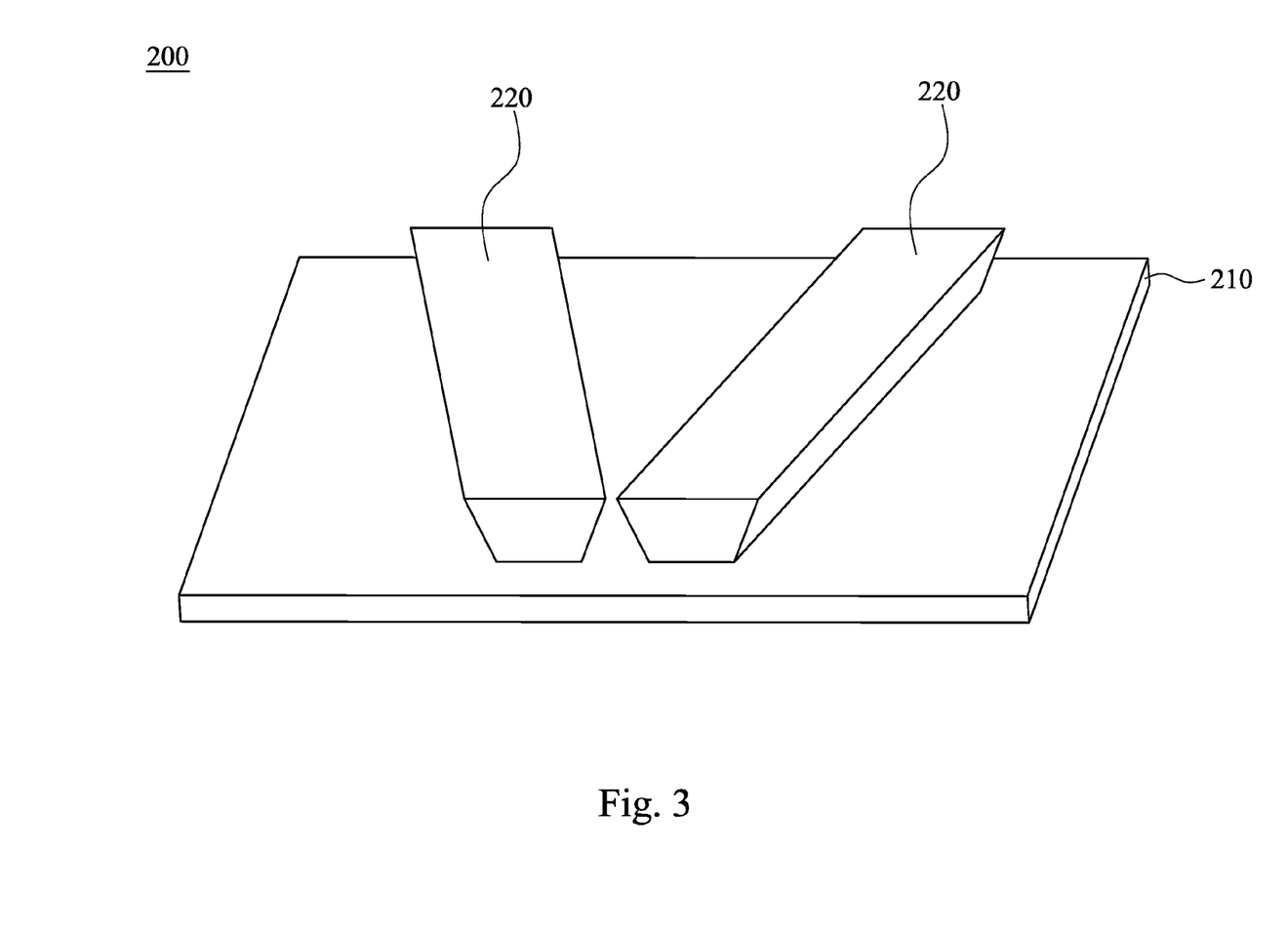
FIG. 3 is a three dimensional view of a semiconductor structure in accordance with an embodiment.

FIG. 3 is a three dimensional view of a semiconductor structure 200 in accordance with an embodiment. One should note that some of the structures have been omitted for the purpose of simplicity and clarity. FIG. 3 illustrates a plurality of conductive lines 220, for example two conductive lines 220, which are disposed on a semiconductor substrate 210 and not in contact with each other in an ideal state. In some embodiments, each of the conductive lines 220 has a cross section including a trapezoid shown in FIG. 3. The conductive lines 220 may be made of copper (Cu), aluminum (Al) or other suitable materials.

Figure 4A:
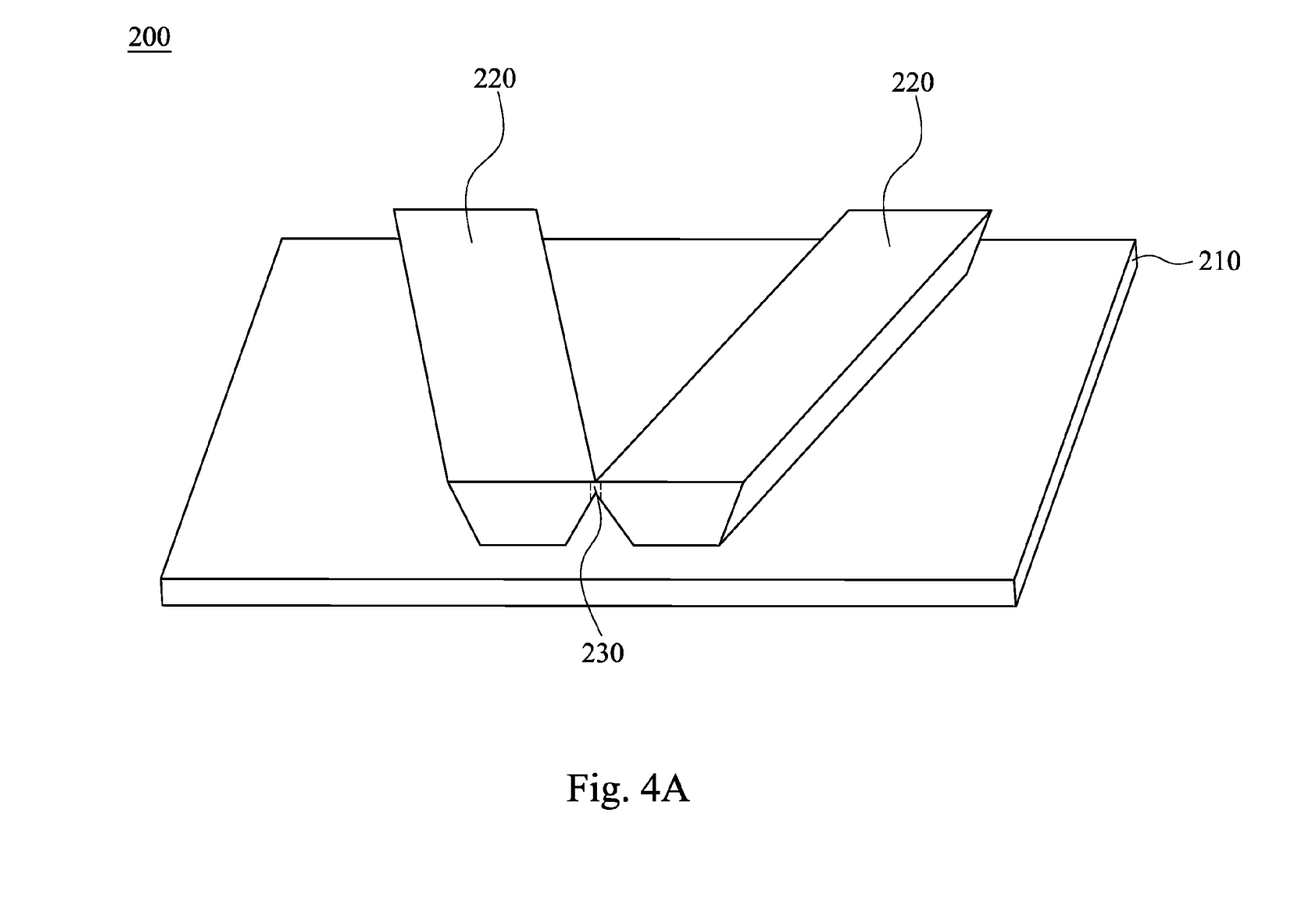
FIG. 4A is a three dimensional view of a semiconductor structure in accordance with another embodiment.

FIG. 4A is a three dimensional view of a semiconductor structure 200 in accordance with another embodiment. In some embodiments, the conductive lines 220 having a wider critical dimension (CD) are close to each other. According to some embodiments, a portion of the conductive line 220 having a via (not shown) thereon is close to another conductive line 220. When the conductive line 220 is close to another conductive line 220, a shorting contact/shorting bridge 230 may easily formed to sandwich between and electrically connect the two conductive lines 220 during the BEOL processing, resulting of short circuits shown in FIG. 4A.

FIG. 4A illustrates at least two conductive lines 220 which are disposed on a semiconductor substrate 210, and at least one shorting contact/shorting bridge 230 which is sandwiched between and in contact with the conductive lines 220. The short circuits often occur through the shorting contact/shorting bridge 230 formed during the BEOL processing, and the shorting contact/shorting bridge 230 electrically connects the two conductive lines 220 shown in FIG. 4A. The shorting contact/shorting bridge 230 between the two conductive lines, which causes short circuits, is a defect in the semiconductor structure 200. The conductive lines 220 are produced by patterning a metal layer, so it may be metal lines, conductive patterns or metal patterns.

In some embodiments, the conductive lines 220 shown in FIG. 4A belong to a layer of the patterned conductive layers which are formed during the BEOL processing. In an embodiment, the conductive lines 220 are made of cooper (Cu), aluminum (Al) or other suitable materials. The formation of the conductive lines 220 includes deposition and patterning. In the beginning, a conductive layer (not shown), for example, a metal layer, is deposited on the semiconductor substrate 210 by chemical vapor deposition (CVD), physical vapor deposition (PVD), plating, atomic layer deposition (ALD) or other suitable techniques. Thereafter, the conductive layer is patterned using a photolithography process to form a patterned photoresist layer (not shown) and an etching process to etch the conductive layer within the openings of the patterned photoresist layer. In another embodiment, the patterned mask layer includes a patterned photoresist layer formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper methods such as maskless photolithography, electron-beam writing, ion-beam writing, and molecular imprint. In yet another embodiment, the etching process is applied to the conductive layer through the openings of the patterned photoresist layer. The etching process may include dry etching, wet etching or a combination thereof to selectively remove undesired portions of the conductive layer so as to form the conductive lines 220 shown in FIG. 4A.

Figure 4B:
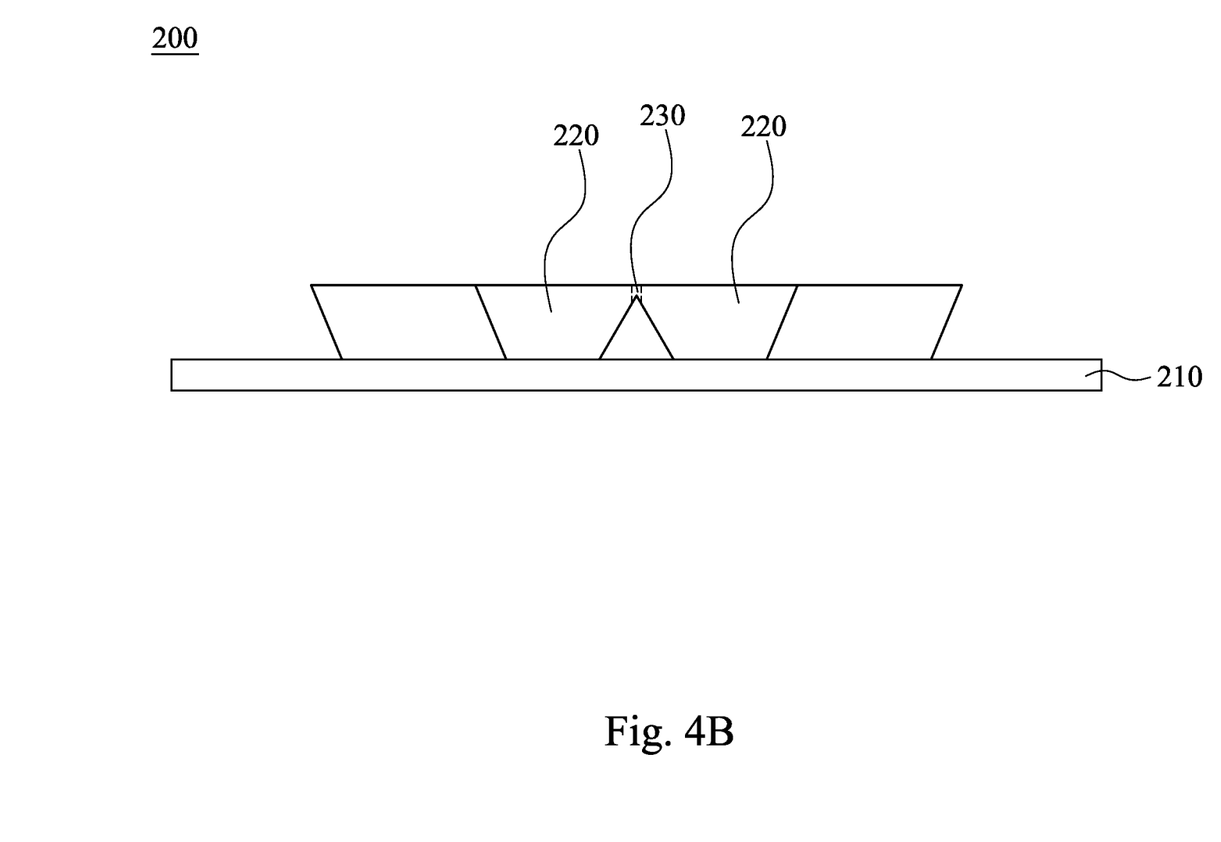
FIG. 4B is a side view in FIG. 4A according to some embodiments.

FIG. 4B is a side view in FIG. 4A according to some embodiments of the present disclosure. FIG. 4B illustrates the side view of the semiconductor structure 200 shown in FIG. 4A. The cross section of the conductive lines 220 may include, but not limit to, a rectangle, a trapezoid or other suitable shapes. In some embodiments, each of the conductive lines 220 has a cross section including a rectangle shown in FIG. 4B.

In addition, the shorting contact/shorting bridge 230 may be formed between the top surfaces of the two conductive lines 220, and has the same horizontal plane with the top surfaces of the conductive lines 220, as shown in FIG. 4B. The materials of the shorting contact/shorting bridge 230 and the conductive lines 220 may be the same which include cooper (Cu), aluminum (Al) or other suitable materials. Since the two conductive lines 220 are close to each other, the shorting contact/shorting bridge 230 may be easily formed during the BEOL processing shown in FIG. 4B, resulting in short circuits.

Figure 5A:
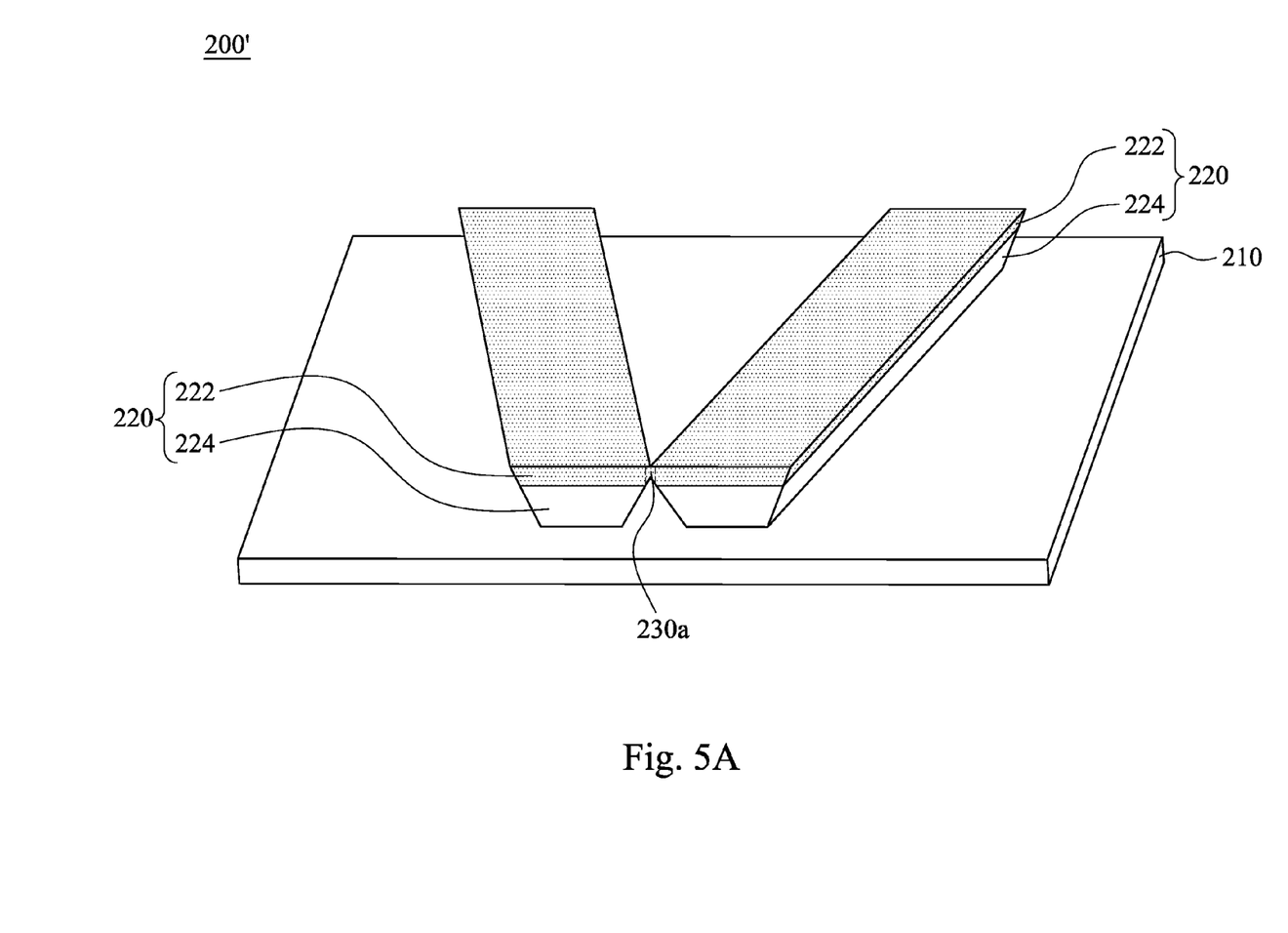
FIG. 5A is a three dimensional view of a semiconductor structure in accordance with some embodiments.

FIG. 5A is a three dimensional view of a semiconductor structure 200' in accordance with some embodiments. For the purpose of solving the short circuit issue as described above, the present disclosure provides a method, which may insulate the shorting contact/shorting bridge 230 (shown in FIG. 4A-4B) so as to make the conductive lines 220 electrically isolated to each other. The method includes providing a patterned mask (not shown) to cover the conductive lines 220 and expose the shorting contact/shorting bridge 230 (shown in FIG. 4A-4B), and then, insulating the shorting contact/shorting bridge 230 to form an insulated shorting contact/insulated shorting bridge 230a. The insulation process of the shorting bridge 230 may include, but not limit to, oxidizing or nitriding the shorting contact/shorting bridge 230. For instance, the shorting contact/shorting bridge 230 may be oxidized by applying $O_2$ plasma to the shorting contact/shorting bridge 230. The $O_2$ plasma with $Ar^+$ or $N^+$ gas may bombard the shorting contact/shorting bridge 230 so as to form an oxidized shorting contact/shorting bridge.

In some embodiments, non-conductive surfaces 222 of the conductive lines 220 may also be formed while insulating the shorting contact/shorting bridge 230 (shown in FIGS. 4A-4B), so that each of the conductive lines 220 has a non-conductive surface 222 and a remaining conductive portion 224 shown in FIG. 5A. FIG. 5A illustrates a semiconductor structure 200' formed after insulating the shorting contact/shorting bridge 230 (shown in FIGS. 4A-4B) and forming non-conductive surfaces 222 of the conductive lines 220 of the semiconductor structure 200 in FIG. 4A.

Forming non-conductive surfaces 222 of the conductive lines 220 may include, but not limit to, oxidizing or nitriding top surfaces of the conductive lines 220. In greater detail, the top surfaces of the conductive lines 220 may be oxidized by applying $O_2$ plasma to the top surfaces of the conductive lines 220. The $O_2$ plasma with $Ar^+$ or $N^+$ gas may bombard the top surfaces of the conductive lines 220 so as to form the non-conductive surfaces 222 of the conductive lines 220. According to some embodiments, the shorting contact/shorting bridge 230 and the top surfaces of the conductive lines 220 in FIGS. 4A-4B may be oxidized in a step at the same time.

Figure 5B:
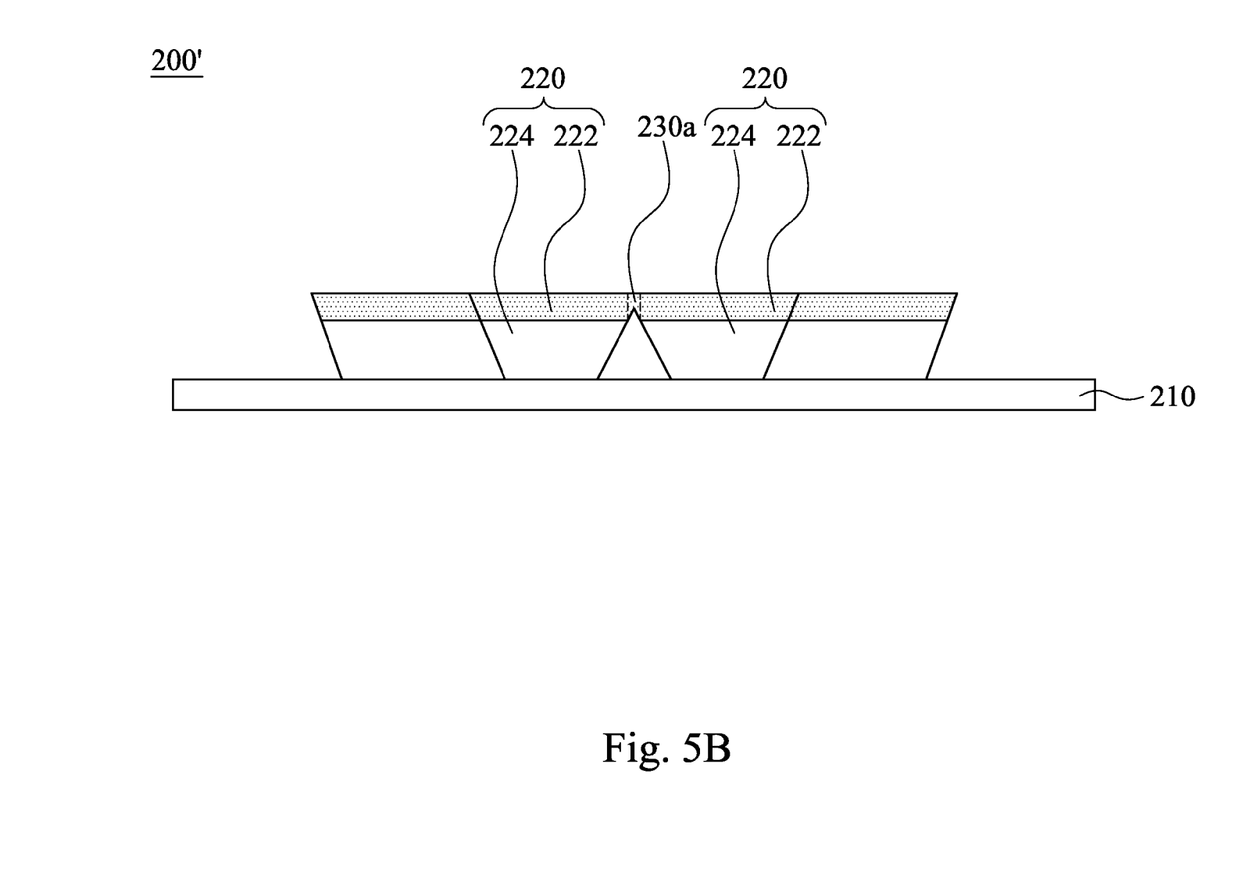
FIG. 5B is a side view in FIG. 5A according to some embodiments of the present disclosure.

FIG. 5B is a side view in FIG. 5A according to some embodiments of the present disclosure. FIG. 5B illustrates the side view of the semiconductor structure 200' shown in FIG. 5A. According to some embodiments, the semiconductor structure 200' includes a semiconductor substrate 210, a plurality of conductive lines 220 which are disposed on the semiconductor substrate 210, and at least one insulated shorting contact/insulated shorting bridge 230a which is sandwiched between and in contact with the conductive lines 220.

In some embodiments, a thickness of the insulated shorting contact/insulated shorting bridge 230a is less than or equal to a thickness of the non-conductive surfaces 222 of the conductive lines 220. As shown in FIG. 5B, the thickness of the insulated shorting contact/insulated shorting bridge 230a is equal to the thickness of the non-conductive surfaces 222 of the conductive lines 220. Furthermore, the thickness of the non-conductive surfaces 222 of the conductive lines 220 is about 30 Å to about 150 Å according to some embodiment. Particularly, the thickness of the non-conductive surfaces 222 of the conductive lines 220 may be about 30 Å to about 100 Å. Besides, the insulated shorting contact/insulated shorting bridge 230a and the non-conductive surfaces 222 of the conductive lines 220 are co-planar and have the same horizontal plane shown in FIG. 5B.

According to some embodiments, a material of the insulated shorting contact/insulated shorting bridge 230a and the non-conductive surfaces 222 of the conductive lines 220 are the same, and the same material may be a high resistance material. In an embodiment, the resistance value of the high resistance material is about $1.6*10^{-6}$ Ω-cm to about $1.6*10^4$ Ω-cm. The high resistance material may include, but not limit to, copper oxide, copper nitride, aluminum oxide, aluminum nitride or other suitable materials. Particularly, the copper oxide may include $Cu_xO_y$, x is 1 or 2, and y is 1 or 2.

The thickness of the conductive lines 220 is greater than the thickness of the shorting contact/shorting bridge 230 (shown in FIG. 4A-4B), so that each of the conductive lines 220 has a remaining conductive portion 224 after oxidizing. For instance, the thickness of the conductive lines 220 is about 800 Å to about 1000 Å, and the thickness of the shorting contact/shorting bridge 230 (shown in FIG. 4A-4B) is about 30 Å to about 150 Å, particularly about 30 Å to about 100 Å. Therefore, only the top surfaces of the conductive lines 220 and the entire shorting contact/shorting bridge 230 (shown in FIG. 4A-4B) are transformed to non-conductive after the oxide treatment process. After the oxide treatment process, the shorting contact/shorting bridge 230 (shown in FIG. 4A-4B) is totally converted into as the insulated shorting contact/insulated shorting bridge 230a, but the conductive lines 220 are merely oxidized the top surfaces and still have the remaining conductive portions 224 which can transmit electrical current. Accordingly, it can solve the short circuit issue during the BEOL processing.

The embodiments of the present disclosure discussed above have advantages over existing methods and structures. The method of forming a semiconductor structure, which includes an insulation process after forming the conductive lines during the BEOL processing. The insulation process may include an oxide treatment, and is referred as a post conductive line treatment according to some embodiments. The post conductive line treatment can insulate the shorting bridge and make the conductive lines electrically isolated to each other, otherwise short circuits might occur. It is noteworthy that the physical failure analysis (PFA) result of the semiconductor structure without the post conductive line treatment during the BEOL processing shows the shorting bridge, which is sandwiched between and electrically connect the conductive lines resulting in short circuits, is a yield killer. Therefore, using the insulation process to make an insulated shorting bridge, so that the conductive lines are electrically isolated to each other and the short circuit issue for the semiconductor structure is thereby improved.

In accordance with some embodiments of the present disclosure, a method for forming a semiconductor structure includes following steps. A structure on a semiconductor substrate is received, which the structure includes at least two conductive lines and a shorting bridge, and the conductive lines electrically connected to each other through the shorting bridge. The shorting bridge is insulated to make the conductive lines electrically isolated to each other.

In accordance with other embodiments of the present disclosure, a method for forming a semiconductor structure includes following steps. A substrate is received. A plurality of conductive lines are formed on the substrate, and at least one shorting bridge is sandwiched between and in contact with the conductive lines. The shorting bridge is insulated to form an insulated shorting bridge.

In accordance with yet other embodiments of the present disclosure, a method for forming a semiconductor structure includes following steps. A semiconductor substrate is provided. At least two conductive lines are formed on the semiconductor substrate, and at least one shorting contact is sandwiched between and electrically connected the conductive lines. A dielectric layer is formed over the conductive lines, which the dielectric layer includes at least two first portions and a second portion. The first portions are aligned with the conductive lines, and the second portion is extended from one of the two first portions to another one of the two first portions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, the method comprising:
    receiving a structure on a semiconductor substrate, wherein the structure comprises at least two conductive lines and a shorting bridge, and the conductive lines electrically connected to each other through the shorting bridge; and
    insulating the shorting bridge to make the conductive lines electrically isolated to each other.

2. The method of claim 1, further comprising forming a non-conductive surface of the conductive lines.

3. The method of claim 2, wherein forming a non-conductive surface of the conductive lines comprises oxidizing a surface of the conductive lines.

4. The method of claim 1, wherein insulating the shorting bridge comprises oxidizing the shorting bridge.

5. The method of claim 4, further comprising oxidizing a surface of the conductive lines.

6. The method of claim 5, wherein oxidizing the shorting bridge and oxidizing the surface of the conductive lines comprise:
    applying $O_2$ plasma to the shorting bridge and the surface of the conductive lines to form an oxidized shorting bridge and an oxidized surface of the conductive lines.

7. The method of claim 6, wherein the oxidized shorting bridge and the oxidized surface of the conductive lines comprise $Cu_xO_y$, x is 1 or 2, and y is 1 or 2.

8. A method for forming a semiconductor structure, the method comprising:
    receiving a substrate;
    forming a plurality of conductive lines on the substrate, wherein at least one shorting bridge is sandwiched between and in contact with the conductive lines; and
    insulating the shorting bridge to form an insulated shorting bridge.

9. The method of claim 8, wherein insulating the shorting bridge to form the insulated shorting bridge comprises oxidizing the shorting bridge.

10. The method of claim 9, wherein oxidizing the shorting bridge comprises applying $O_2$ plasma to the shorting bridge.

11. The method of claim 8, wherein insulating the shorting bridge to form the insulated shorting bridge comprises nitriding the shorting bridge.

12. The method of claim 8, wherein the conductive lines and the shorting bridge comprise a same material.

13. The method of claim 12, wherein the same material comprises copper or aluminum.

14. The method of claim 8, wherein the insulated shorting bridge comprises copper oxide, copper nitride, aluminum oxide or aluminum nitride.

15. The method of claim 14, wherein the copper oxide comprises $Cu_xO_y$, x is 1 or 2, and y is 1 or 2.

16. A method for forming a semiconductor structure, comprising:
    providing a semiconductor substrate;
    forming at least two conductive lines on the semiconductor substrate, wherein at least one shorting contact is sandwiched between and electrically connected the at least two conductive lines; and
    forming a dielectric layer over the at least two conductive lines, wherein the dielectric layer having at least two first portions and a second portion, the at least two first portions are aligned with the at least two conductive lines, and the second portion is extended from one of the two first portions to another one of the two first portions.

17. The method of claim 16, wherein forming the at least two conductive lines on the semiconductor substrate comprises:
    forming a metal layer on the semiconductor substrate;
    forming a patterned photoresist layer by a photolithography process; and
    etching the metal layer with the patterned photoresist layer.

18. The method of claim 16, wherein forming the dielectric layer over the at least two conductive lines comprises oxidizing or nitriding a top surface of the at least two conductive lines and the at least one shorting contact.

19. The method of claim 16, wherein the at least two first portions and the second portion are co-planar.

20. The method of claim 16, wherein each of the at least two first portions has a thickness about 30 Å to about 150 Å.

* * * * *